United States Patent
Weng et al.

(10) Patent No.: US 8,980,674 B2
(45) Date of Patent: *Mar. 17, 2015

(54) IMAGE SENSOR WITH IMPROVED DARK CURRENT PERFORMANCE

(71) Applicant: Taiwan Semiconductor Manufacturing Company Ltd., Hsin-Chu (TW)

(72) Inventors: Wei-Chih Weng, Tainan (TW);
Hsun-Ying Huang, Tainan (TW);
Yung-Cheng Chang, Zhubei (TW);
Jin-Hong Cho, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/225,509

(22) Filed: Mar. 26, 2014

(65) Prior Publication Data

US 2014/0197513 A1 Jul. 17, 2014

Related U.S. Application Data

(62) Division of application No. 13/295,145, filed on Nov. 14, 2011, now Pat. No. 8,697,472.

(51) Int. Cl.
*H01L 21/00* (2006.01)
*H01L 31/102* (2006.01)

(52) U.S. Cl.
USPC .......................................... 438/64; 257/189

(58) Field of Classification Search
USPC ....... 257/184–191, 637, E23.078; 438/57–69
See application file for complete search history.

(56) References Cited

U.S. PATENT DOCUMENTS

| 5,583,074 | A | 12/1996 | Fuller et al. |
| 6,627,506 | B2 | 9/2003 | Kuhn et al. |
| 7,541,212 | B2 | 6/2009 | Oh |
| 8,405,182 | B2 * | 3/2013 | Chou et al. .................... 257/435 |
| 8,697,472 | B2 * | 4/2014 | Weng et al. .................... 438/64 |

* cited by examiner

*Primary Examiner* — Calvin Lee
(74) *Attorney, Agent, or Firm* — Haynes and Boone, LLP

(57) ABSTRACT

Provided is a semiconductor image sensor device. The image sensor device includes a semiconductor substrate that includes an array region and a black level correction region. The array region contains a plurality of radiation-sensitive pixels. The black level correction region contains one or more reference pixels. The substrate has a front side and a back side. The image sensor device includes a first compressively-stressed layer formed on the back side of the substrate. The first compressively-stressed layer contains silicon nitride. The image sensor device includes a metal shield formed on the compressively-stressed layer. The metal shield is formed over at least a portion of the black level correction region. The image sensor device includes a second compressively-stressed layer formed on the metal shield and the first compressively-stressed layer. The second compressively-stressed layer contains silicon oxide. A sidewall of the metal shield is protected by the second compressively-stressed layer.

19 Claims, 5 Drawing Sheets

IMAGE SENSOR WITH IMPROVED DARK CURRENT PERFORMANCE

PRIORITY DATA

The present application is a divisional patent application of U.S. patent application Ser. No. 13/295,145, filed on Nov. 14, 2011 now U.S. Pat. No. 8,697,472 issued Apr. 15, 2014, entitled "Image Sensor with Improved Dark Current Performance", the disclosure of which is hereby incorporated by reference in its entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. These BSI image sensor devices are operable to detect light projected from the backside. The BSI image sensors may have metal shields formed over reference pixels on the back side, so as to prevent light from reaching the reference pixels. Traditional semiconductor image sensor devices may experience large amounts of stress fluctuations caused at least in part by the existence of these metal shields. The stress within the image sensor devices can result in poor dark current performance of the image sensor.

Therefore, while existing semiconductor image sensors have been generally adequate for their intended purposes, they are not entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
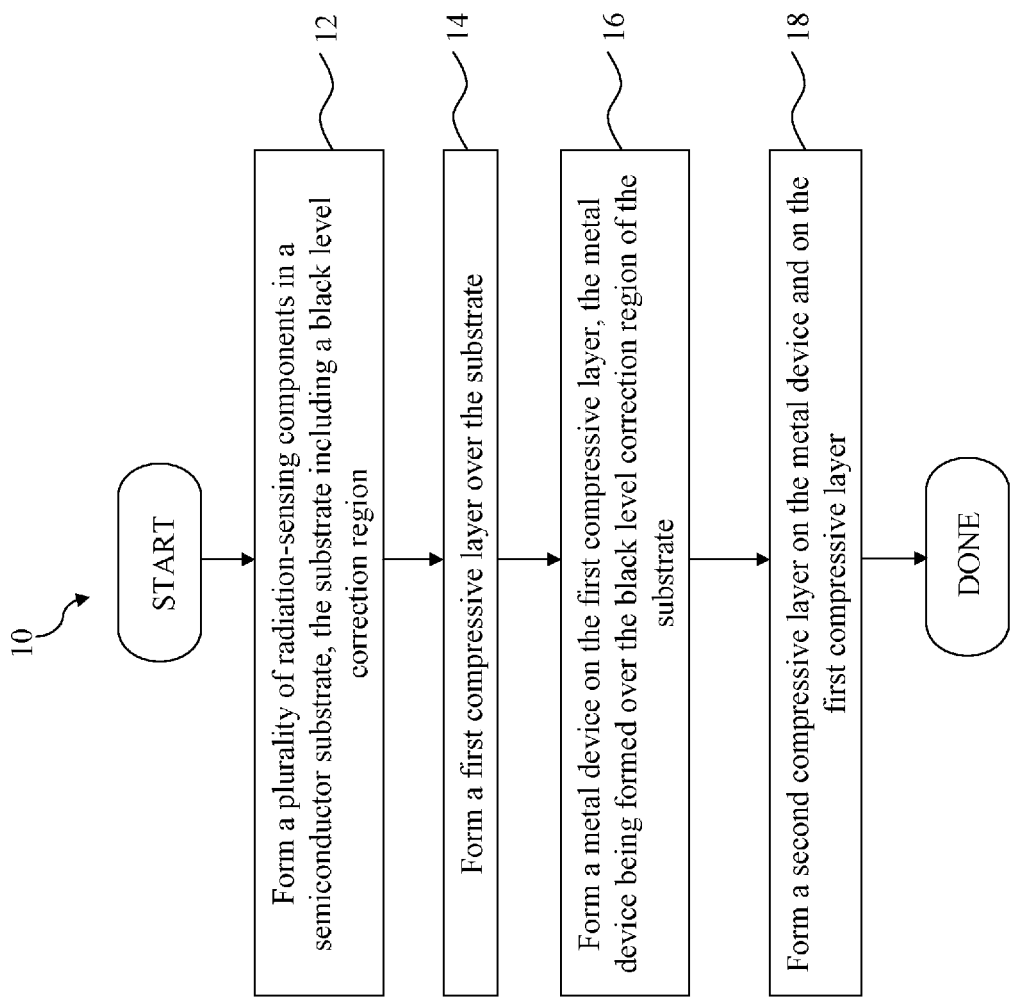
FIG. 1 is a flowchart illustrating a method for fabricating an image sensor device according to various aspects of the present disclosure.

Illustrated in FIG. 1 is a flowchart of a method 10 for fabricating a semiconductor image sensor device according to various aspects of the present disclosure. Referring to FIG. 1, the method 10 begins with block 12 in which a plurality of radiation-sensing components is formed in a semiconductor substrate. The substrate includes a black level correction region. The method 10 continues with block 14, in which a first compressive layer is formed over the substrate. The method 10 continues with block 16 in which a metal device is formed on the first compressive layer. The metal device is formed over the black level correction region of the substrate. The method 10 continues with block 18 in which a second compressive layer is formed on the metal device and on the first compressive layer. It is understood that additional processing steps may be performed before, during, or after the method 10 of FIG. 1. But for the sake of simplicity, these additional processing steps are not discussed in detail herein.

FIGS. 2 to 5 are diagrammatic fragmentary sectional side views of various embodiments of an apparatus that is a back side illuminated (BSI) image sensor device 30 at various stages of fabrication according to aspects of the method 10 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 5 have been simplified for a better understanding of the inventive concepts of the present disclosure and may not be drawn to scale.

Figure 2:
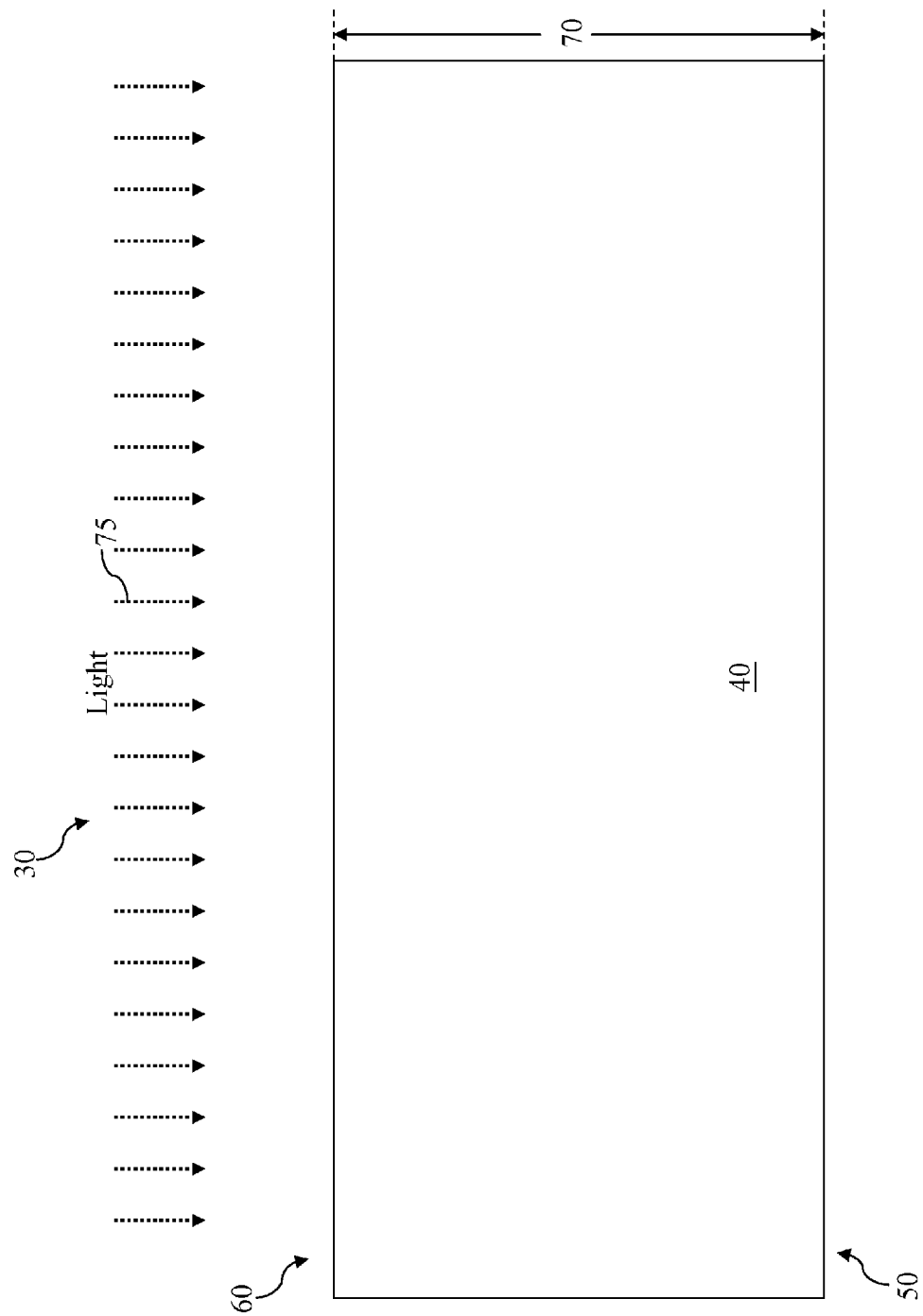
FIGS. 2-5 are diagrammatic fragmentary cross-sectional side views of an image sensor device at various stages of fabrication in accordance with various aspects of the present disclosure.

With reference to FIG. 2, the image sensor device 30 includes a substrate 40, hereinafter referred to as a device substrate. The device substrate 40 is a silicon substrate doped with a p-type dopant such as Boron (for example a p-type substrate). Alternatively, the device substrate 40 could be another suitable semiconductor material. For example, the device substrate 40 may be a silicon substrate that is doped with an n-type dopant such as Phosphorous or Arsenic (an n-type substrate). The device substrate 40 could include other elementary semiconductors such as germanium and diamond. The device substrate 40 could optionally include a compound semiconductor and/or an alloy semiconductor. Further, the device substrate 40 could include an epitaxial layer (epi layer), may be strained for performance enhancement, and may include a silicon-on-insulator (SOI) structure.

Referring back to FIG. 2, the device substrate 40 has a front side (also referred to as a front surface) 50 and a back side (also referred to as a back surface) 60. For a BSI image sensor device such as the image sensor device 30, radiation is projected from the back side 60 and enters the substrate 40 through the back surface. The device substrate 40 also has an initial thickness 70. In some embodiments, the initial thickness 70 is in a range from about 100 microns (um) to about 3000 um, for example between about 500 um and about 1000 um.

A plurality of dielectric trench isolation (STI) structures is formed in the substrate 40. In some embodiments, the STI structures are formed by the following process steps: etching openings into the substrate 40 from the front side 50; filling the openings with a dielectric material such as silicon oxide, silicon nitride, silicon oxynitride, a low-k material, or another suitable dielectric material; and thereafter performing a polishing process—for example a chemical mechanical polishing (CMP) process—to planarize the surface of the dielectric material filling the openings. In some embodiments, deep trench isolation (DTI) structures may be formed. The formation processes for the DTI structures may be similar to the STI structures, though the DTI structures are formed to have greater depths than the STI structures. In certain embodiments, doped isolation structures may also be formed. These doped isolation structures may be formed by one or more ion implantation processes. The doped isolation structures may be formed to replace or to supplement the STI or DTI structures.

A plurality of pixels is formed in the substrate 40. The pixels contain radiation-sensing doped regions. These radiation-sensing doped regions are formed by one or more ion implantation processes or diffusion processes and are doped with a doping polarity opposite from that of the substrate 40 (or the doped region 140). Thus, in the embodiment illustrated, the pixels contain n-type doped regions. For a BSI image sensor device such as the image sensor device 30, the pixels are operable to detect radiation, such as an incident light 75, that is projected toward device substrate 40 from the back side 60.

In some embodiments, the pixels each include a photodiode. A deep implant region may be formed below each photodiode in some embodiments. In other embodiments, the pixels may include pinned layer photodiodes, photogates, reset transistors, source follower transistors, and transfer transistors. The pixels may also be referred to as radiation-detection devices or light-sensors. The pixels may be varied from one another to have different junction depths, thicknesses, widths, and so forth. It is understood that each pair of adjacent or neighboring pixels may be separated from each other by a respective one of the isolation structures discussed above. For the sake of simplicity, neither the pixels nor the isolation structures are specifically illustrated herein.

Figure 3:
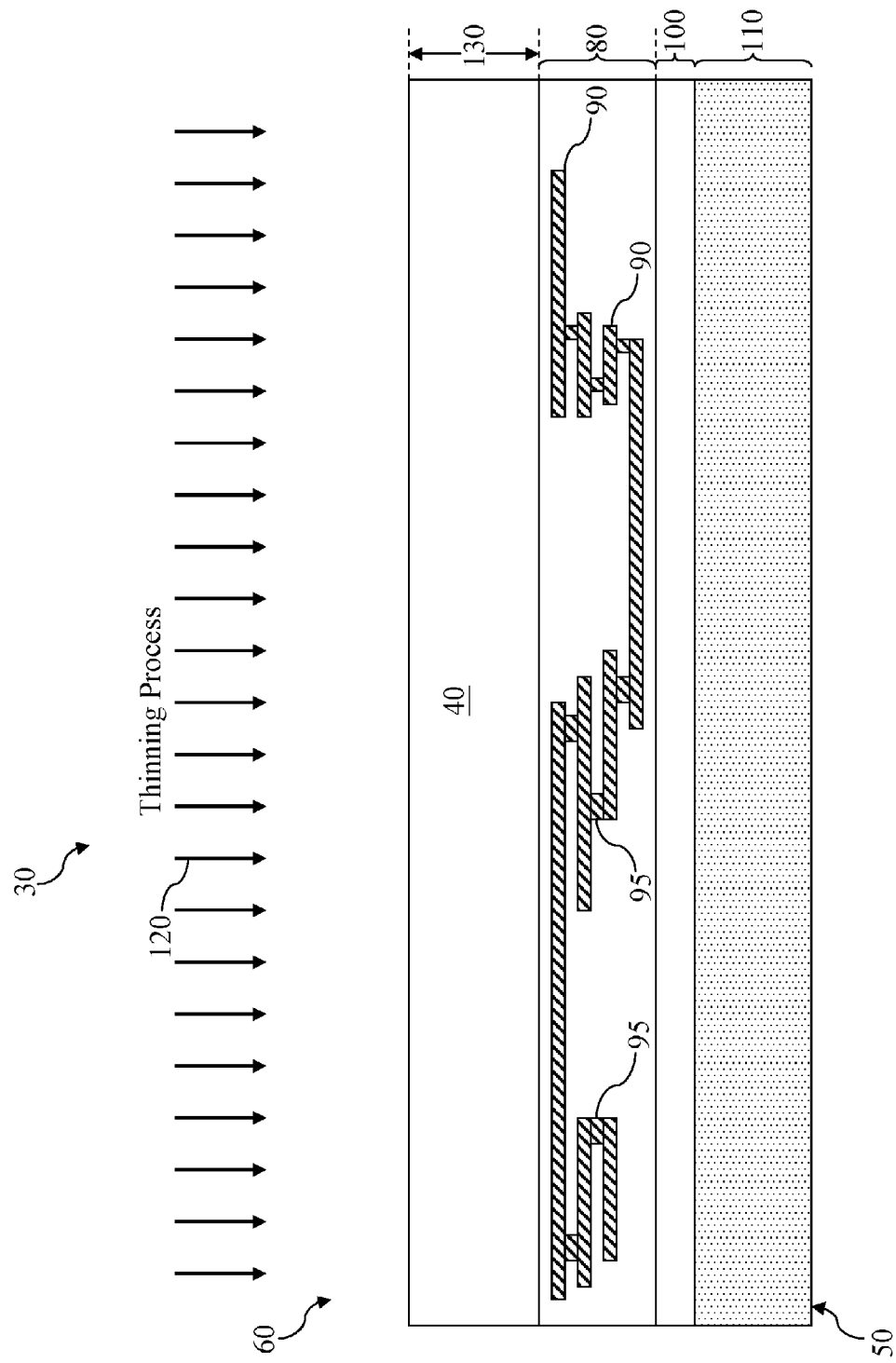

Referring now to FIG. 3, an interconnect structure 80 is formed over the front side 50 of the device substrate 40. The interconnect structure 80 includes a plurality of patterned dielectric layers and conductive layers that provide interconnections (e.g., wiring) between the various doped features, circuitry, and input/output of the image sensor device 30. The interconnect structure 80 includes an interlayer dielectric (ILD) and a multilayer interconnect (MLI) structure. The MLI structure includes contacts, vias and metal lines. For purposes of illustration, a plurality of conductive lines 90 and vias/contacts 95 are shown in FIG. 3, it being understood that the conductive lines 90 and vias/contacts 95 illustrated are merely exemplary, and the actual positioning and configuration of the conductive lines 90 and vias/contacts 95 may vary depending on design needs and manufacturing concerns.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 95) and horizontal connection (for example, conductive lines 90). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 3, a buffer layer 100 is formed on the interconnect structure 80. In the present embodiment, the buffer layer 100 includes a dielectric material such as silicon oxide. Alternatively, the buffer layer 100 may optionally include silicon nitride. The buffer layer 100 is formed by CVD, PVD, or other suitable techniques. The buffer layer 100 is planarized to form a smooth surface by a CMP process.

Thereafter, a carrier substrate 110 is bonded with the device substrate 40 through the buffer layer 100, so that processing of the back side 60 of the device substrate 40 can be performed. The carrier substrate 110 in the present embodiment is similar to the substrate 40 and includes a silicon material. Alternatively, the carrier substrate 110 may include a glass substrate or another suitable material. The carrier substrate 110 may be bonded to the device substrate 40 by molecular forces—a technique known as direct bonding or optical fusion bonding—or by other bonding techniques known in the art, such as metal diffusion or anodic bonding.

Referring back to FIG. 3, the buffer layer 100 provides electrical isolation between the device substrate 40 and the carrier substrate 110. The carrier substrate 110 provides protection for the various features formed on the front side 50 of the device substrate 40, such as the pixels formed therein. The carrier substrate 110 also provides mechanical strength and support for processing of the back side 60 of the device substrate 40 as discussed below. After bonding, the device substrate 40 and the carrier substrate 110 may optionally be annealed to enhance bonding strength.

Still referring to FIG. 3, after the carrier substrate 110 is bonded, a thinning process 120 is then performed to thin the device substrate 40 from the backside 60. The thinning process 120 may include a mechanical grinding process and a chemical thinning process. A substantial amount of substrate material may be first removed from the device substrate 40 during the mechanical grinding process. Afterwards, the chemical thinning process may apply an etching chemical to the back side 60 of the device substrate 40 to further thin the device substrate 40 to a thickness 130, which is on the order of a few microns. In some embodiments, the thickness 130 is greater than about 1 um but less than about 3 um. It is also understood that the particular thicknesses disclosed in the present disclosure are mere examples and that other thicknesses may be implemented depending on the type of application and design requirements of the image sensor device 30.

Figure 4:
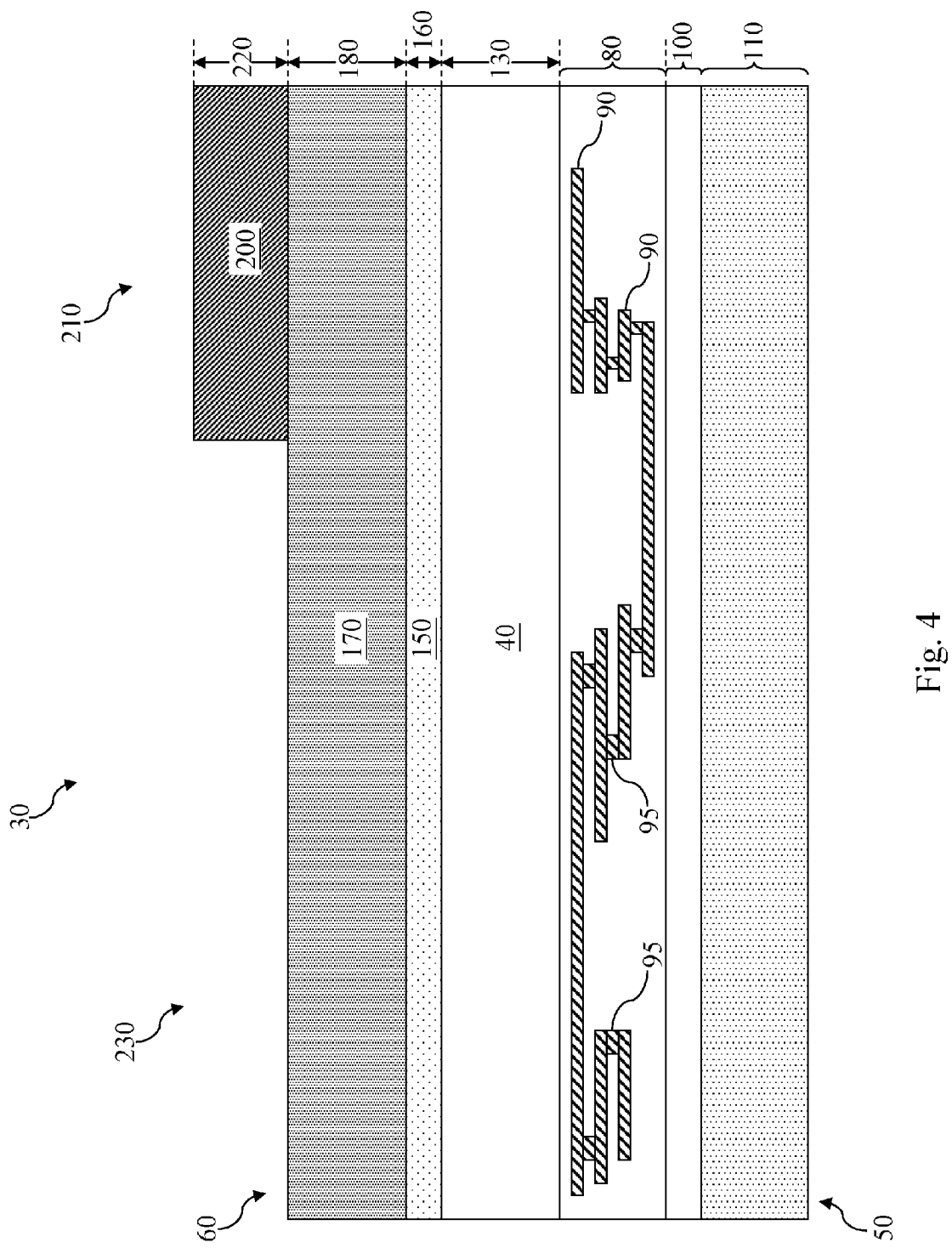

Referring now to FIG. 4, a compressive layer 150 is formed over the device substrate 40 from the back side 60. The compressive layer 150 has a thickness 160. In some embodiments, the thickness 160 is less than about 500 Angstroms. In some embodiments, the compressive layer 150 contains silicon oxide. The compressive layer 150 is operable to deliver a compressive stress to layers above and/or below. In general, compressive stress is a type of stress on a material that leads to contraction of the material, meaning the length of the material tends to decrease in the compressive direction. Compressive stress is opposite from tensile stress, which is a type of stress on a material that leads to expansion of the material, which means the length of the material tends to increase in the tensile direction. The compressive layer 150 herein also serves as a buffer layer between the device substrate 40 and the layers to be formed over the substrate 40 from the back side 60.

A compressive layer 170 is formed over the compressive layer 150. The compressive layer 170 also delivers a compressive stress to layers above and/or below. The compressive layer 170 has a thickness 180. In some embodiments, the thickness 180 is greater than about 300 Angstroms but less than about 3000 Angstroms. In some embodiments, the compressive layer 170 contains silicon nitride. The silicon nitride material may be tuned to be compressively stressed by adjusting parameters such as a Radio-Frequency (RF) power range and a $SiH_4$ gas content during the formation of the silicon nitride. In certain embodiments, the compressive stress of the compressive film is greater than about $-10 \times 10^8$ dyne/centimeters$^2$ in magnitude. Stated differently, the absolute value of the compressive stress of the compressive film is greater than about $10 \times 10^8$ dyne/centimeters$^2$.

A metal device 200 is formed on a portion of the compressive layer 170. The metal device 200 may be formed using a suitable deposition process and patterning process known in the art. The metal device 200 is formed in a region of the image sensor device 30 known as a black level correction region 210. The black level correction region 210 contains one or more reference pixels formed in the device substrate 40 that need to be kept optically dark. Therefore, the metal device 200 is operable to block light penetration from the back side 60 so that the reference pixel below (formed in the substrate 40, not illustrated herein) can be kept dark. Thus, the metal device 200 may also be referred to as a metal shield. In some embodiments, the metal device 200 contains AlCu. The metal device 200 has a thickness 220. In some embodiments, the thickness 220 is greater than about 600 Angstroms but less than about 3500 Angstroms. In the embodiments illustrated herein, the metal device 200 is a tensile device.

In addition to the black level correction region 210, the image sensor device 30 also has an array region 230, which contains "regular" pixels that are operable to detect light and should not be kept dark. Thus, no light-blocking devices are formed over the compressive layer 170 in the array region 230.

Figure 5:
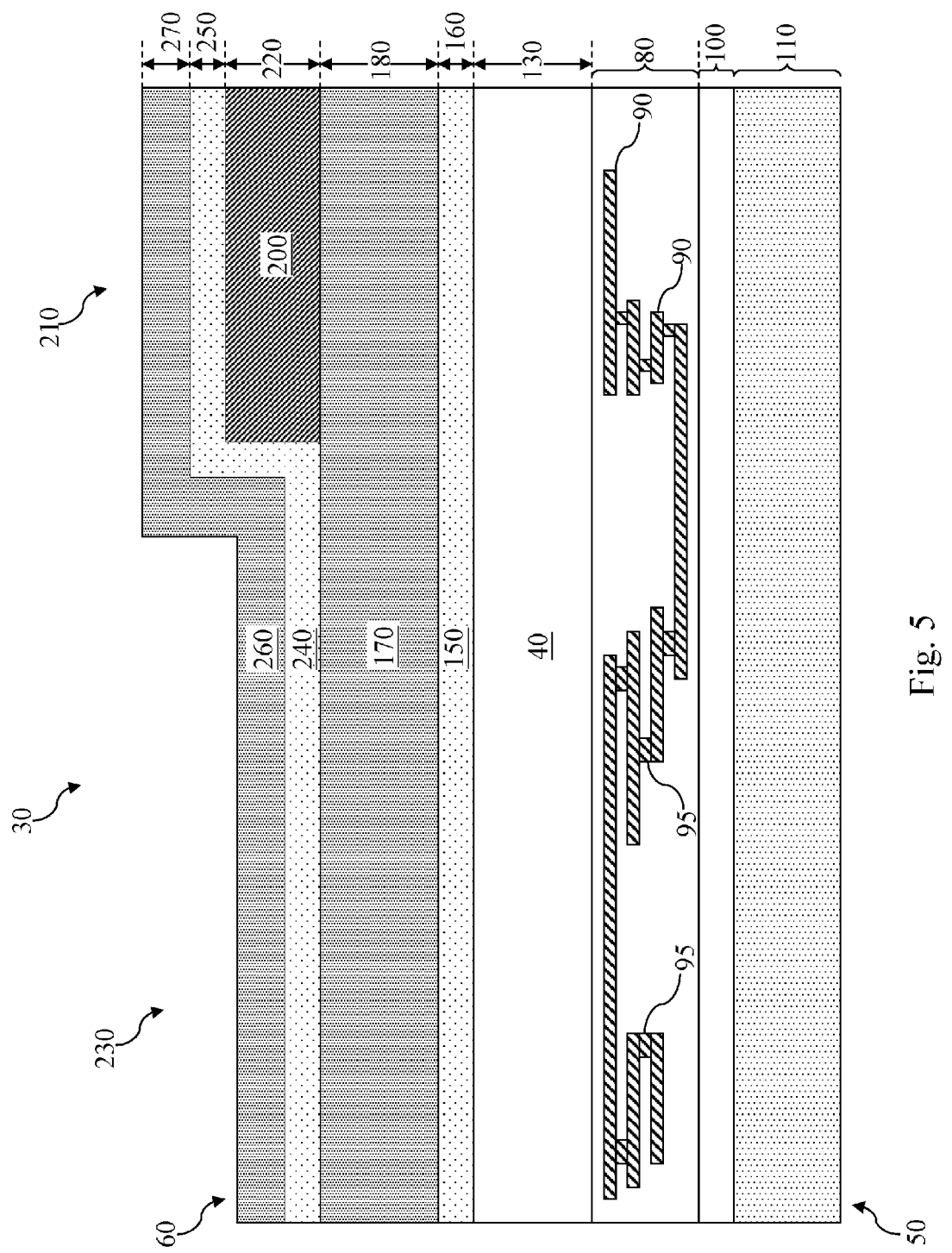

Referring now to FIG. 5, a compressive layer 240 is formed over the metal device 200 and over the exposed surface of the compressive layer 170. In other words, the compressive layer 240 is formed in both the black level correction region 210 and the array region 230. The sidewall of the metal device 200 is covered by the compressive layer 240. The compressive layer 250 delivers a compressive stress to the metal device 200. The compressive layer 240 has a thickness 250. In some embodiments, the thickness 250 is greater than about 1000 Angstroms but less than about 4000 Angstroms. In some embodiments, the compressive layer 250 contains silicon oxide.

A compressive layer 260 is formed over the compressive layer 240. The compressive layer 260 is formed in both the black level correction region 210 and the array region 230. The compressive layer 260 delivers a compressive stress to the layers below. The compressive layer 260 has a thickness 270. In some embodiments, the thickness 270 is greater than about 1200 Angstroms but less than about 3500 Angstroms. In some embodiments, the compressive layer 260 contains silicon nitride. Similar to the compressive layer 170, the silicon nitride material of the compressive layer 260 may be tuned to be compressively stressed by adjusting parameters such as a Radio-Frequency (RF) power range and a $SiH_4$ gas content during the formation of the silicon nitride. In certain embodiments, the compressive stress of the compressive film is greater than about $-20 \times 10^8$ dyne/centimeters$^2$ in magnitude.

The embodiments discussed above offer advantages over conventional image sensor devices, for example advantages in dark current performances. However, it is understood that not all advantages are necessarily discussed herein, and other embodiments may offer different advantages, and that no particular advantage is required for all embodiments.

Dark current is a common type of image sensor defect and may be defined as the existence of pixel current when no actual illumination is present. In other words, the pixel "detects" light when it is not supposed to. Dark current defects may be caused by stress. In more detail, conventional image sensors may experience excessive amounts of internal stress. The excessive stress may induce a bandgap of a charge carrier to be narrowed, which may result in leakage current. This issue is particular severe in the black level correction region of an image sensor, where a metal device (blocking the reference pixels) may cause a dominant level of tensile stress. Such tensile stress caused by the metal device is not adequately alleviated by conventional image sensors, and therefore dark current defects often times plague conventional image sensors.

In comparison, the image sensor device 30 discussed above utilized a unique and optimized film stacking scheme to reduce the stress of the metal device 200 in the black level region 210. For example, a nitride-containing compressive layer 170 is formed below the metal device 200 according to various embodiments. As discussed above, compressive stress and tensile stress are opposite one another. The compressive layer 170 delivers a compressive stress to the metal device 200 above, thereby reducing the tensile stress of the metal device 200. In addition, the amount of stress delivered by a layer to another layer depends on the relative thicknesses of these layers. Here, the metal device 200 is somewhat thick (e.g., being thousands of Angstroms thick). Thus, to ensure a sufficient amount of compressive stress can be delivered to the metal device 200, the nitride-containing compressive layer 170 is configured to have a relatively large thickness too (e.g., being thousands of Angstroms thick).

Conventional image sensors also fail to protect the sidewalls of the metal devices in the black level region. The lack of sidewall protection of the metal device also leads to leakage current that can degrade the performance of the image sensor. In comparison, the image sensor device 30 discussed according to various embodiments above utilizes an oxide-containing compressive layer 240 to protect the sidewall of the metal device 200. Such sidewall protection reduces the current leakage defects and improves the dark current performance of the image sensor device 200. Moreover, the oxide-containing compressive layer 240 is also configured to deliver a compressive stress to the metal device 200, thereby further reducing the tensile stress of the metal device 200. Once again, to ensure that a sufficient amount of compressive stress can be delivered to the metal device 200, the compressive layer 240 is also designed to have be relatively thick, for example being thousands of Angstroms thick.

It is understood that the compressive layer 150 and the compressive layer 260 are also operable to deliver compressive stress to the metal device 200, even though they are not in direct physical contact with the metal device 200. Through the compressive layers 150, 170, 240, and 260, the total amount of compressive stress delivered to the metal device 200 can substantially balance out the tensile stress of the metal device 200. Stated differently, the metal device 200 may approach a stress-free state. As such, the energy bandgap will not be substantially altered, thereby reducing leakage current and improving dark current performance.

Additional fabrication processes may be performed to complete the fabrication of the image sensor device 40. For example, a color filter layer may be formed on the back side 60 of the substrate 40. The color filter layer may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer containing a plurality of micro-lenses is formed over the color filter layer. The micro-lenses direct and focus the incoming radiation toward specific radiation-sensing regions in the device substrate 40. The micro-lenses may be positioned in various arrangements and have various shapes depending on a refractive index of a material used for the micro-lens and distance from a sensor surface. The device substrate 40 may also undergo an optional laser annealing process before the forming of the color filter layer or the micro-lens layer. For reasons of simplicity, the color filters and the micro-lenses are not specifically illustrated herein.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity. For example, an anti-reflection coating (ARC) layer may be formed over the back side 60 of the substrate 40 before the formation of the color filter layer and/or the micro-lens layer.

It is also understood that the discussions above pertain mostly to a pixel region of the image sensor device 30. In addition to the pixel region, the image sensor 30 also includes a periphery region, a bonding pad region, and a scribe line region. The periphery region may include digital devices, such as application-specific integrated circuit (ASIC) devices or system-on-chip (SOC) devices, or other reference pixels used to establish a baseline of an intensity of light for the image sensor device 30. The bonding pad region is reserved for the formation of bonding pads, so that electrical connections between the image sensor device 30 and external devices may be established. The scribe line region includes a region that separates one semiconductor die from an adjacent semiconductor die. The scribe line region is cut therethrough in a later fabrication process to separate adjacent dies before the dies are packaged and sold as integrated circuit chips. For the sake of simplicity, the details of these other regions of the image sensor device 30 are not illustrated or described herein.

One of the broader forms of the present disclosure involves an image sensor device that includes: a semiconductor substrate that contains a plurality of radiation-sensing regions, the substrate having a first side and a second side opposite the first side; a first compressive layer disposed on the second side of the substrate; a metal device disposed on a portion of the first compressive layer; and a second compressive layer disposed on the metal device.

In some embodiments, the metal device is a tensile device.

In some embodiments, the metal device is disposed over a black level correction region of the substrate, the black level correction region containing a reference pixel.

In some embodiments, the radiation-sensing regions are operable to sense radiation projected toward the substrate from the second side.

In some embodiments, the first compressive layer includes a compressively-stressed silicon nitride material.

In some embodiments, the second compressive layer includes a compressively-stressed silicon oxide material.

In some embodiments, the second compressive layer is disposed on a sidewall of the metal device and on the first compressive layer.

In some embodiments, the image sensor device further includes: a compressive silicon oxide layer disposed between the substrate and the first compressive layer; and a compressive silicon nitride layer disposed on the second compressive layer.

In some embodiments, the second compressive layer has a stress greater than about $-10 \times 10^8$ dyne/centimer$^2$ in magnitude; and the compressive silicon nitride layer has a stress greater than about $-20 \times 10^8$ dyne/centimer$^2$ in magnitude.

Another one of the broader forms of the present disclosure involves an image sensor device that includes: a semiconductor substrate that includes an array region and a black level correction region, wherein the array region contains a plurality of radiation-sensitive pixels, and the black level correction region contains one or more reference pixels, and wherein the substrate has a front side and a back side; a first compressively-stressed layer formed on the back side of the substrate, the first compressively-stressed layer containing silicon nitride; a metal shield formed on the compressively-stressed layer, wherein the metal shield is formed over at least a portion of the black level correction region; and a second compressively-stressed layer formed on the metal shield and the first compressively-stressed layer, wherein the second compressively-stressed layer contains silicon oxide, and wherein a sidewall of the metal shield is protected by the second compressively-stressed layer.

In some embodiments, the radiation-sensitive pixels are configured to detect light that enters the substrate from the back side.

In some embodiments, the metal shield is a tensile device.

In some embodiments, the image sensor device further includes: a third compressively-stressed layer formed between the substrate and the first compressively-stressed layer; and a fourth compressively-stressed layer formed on the second compressively-stressed layer.

In some embodiments, the third compressively-stressed layer contains an oxide material; and the fourth compressively-stressed layer contains a nitride material.

Still another of the broader forms of the present disclosure involves a method of fabricating an image sensor device, the method includes: forming a plurality of radiation-sensing components in a semiconductor substrate, the substrate including a black level correction region; forming a first compressive layer over the substrate; forming a metal device on the first compressive layer, the metal device being formed over the black level correction region of the substrate; and forming a second compressive layer on the metal device and on the first compressive layer.

In some embodiments, the substrate has a front surface and a back surface; the radiation-sensing components are operable to sense light that enters the substrate from the back surface; and the first compressive layer is formed over the back surface of the substrate.

In some embodiments, the black level correction region contains one or more reference pixels.

In some embodiments, the metal device is a tensile device.

In some embodiments, the first compressive layer contains silicon nitride; and the second compressive layer contains silicon oxide.

In some embodiments, a portion of the second compressive layer is formed on a sidewall of the metal device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor image sensor device, comprising:
   forming a plurality of radiation-sensing components in a semiconductor substrate, the substrate including a black level correction region;
   forming a first compressive layer over the substrate;
   forming a metal device on the first compressive layer, the metal device being formed over the black level correction region of the substrate; and
   forming a second compressive layer on the metal device and on the first compressive layer, wherein a portion of the second compressive layer is formed on a sidewall of the metal device.

2. The method of claim 1, wherein:
   the substrate has a front surface and a back surface;
   the radiation-sensing components are operable to sense light that enters the substrate from the back surface; and
   the first compressive layer is formed over the back surface of the substrate.

3. The method of claim 1, wherein the black level correction region contains one or more reference pixels.

4. The method of claim 1, wherein the metal device is a tensile device.

5. The method of claim 1, wherein:
   the first compressive layer contains silicon nitride; and
   the second compressive layer contains silicon oxide.

6. A method of fabricating a semiconductor device, comprising:
   providing a substrate having a front side and a back side, the substrate having radiation-sensing elements disposed in a first region of the substrate;
   thinning the substrate from the back side;
   forming a first compressive layer over the back side of the substrate;
   forming a light shield over a selected portion of the first compressive layer; and
   forming a second compressive layer over the first compressive layer and over the light shield, wherein the forming the second compressive layer over the first compressive layer includes forming the second compressive layer over the radiation-sensing elements disposed in the first region of the substrate.

7. The method of claim 6, wherein the forming of the light shield comprises forming a metal device as the light shield.

8. The method of claim 6, wherein the forming of the light shield comprises forming a tensile device as the light shield.

9. The method of claim 6, wherein:
   the forming of the first compressive layer comprises forming silicon nitride as the first compressive layer; and
   the forming of the second compressive layer comprises forming silicon oxide as the second compressive layer.

10. The method of claim 6, wherein the forming of the second compressive layer is performed such that a portion of the second compressive layer comes into direct contact with a sidewall of the light shield.

11. The method of claim 6, further comprising: before the thinning, bonding the front side of the substrate to a carrier substrate.

12. The method of claim 6, further comprising:
    before the forming of the first compressive layer, forming a third compressive layer over the back side of the substrate, wherein the first compressive layer is formed on the third compressive layer; and
    after the forming of the second compressive layer, forming a fourth compressive layer on the second compressive layer.

13. The method of claim 6, wherein the forming of the light shield is performed so that the light shield is formed over a second region of the substrate that needs to be kept optically dark.

14. The method of claim 13, wherein the second region of the substrate contains one or more reference pixels.

15. A semiconductor image sensor device, comprising:
    a semiconductor substrate having a front side and a back side, the substrate including an array region and a black level correction region, wherein the array region contains a plurality of radiation-sensitive pixels proximate the front side, and the black level correction region contains one or more reference pixels proximate the front side;
    a first compressively-stressed layer formed on the back side of the substrate, the first compressively-stressed layer containing silicon nitride;
    a metal shield formed on the compressively-stressed layer, wherein the metal shield is formed over at least a portion of the black level correction region; and
    a second compressively-stressed layer formed on the metal shield and the first compressively-stressed layer, wherein the second compressively-stressed layer contains silicon oxide, and wherein a sidewall of the metal shield is in direct contact with the second compressively-stressed layer.

16. The image sensor device of claim 15, wherein the radiation-sensitive pixels are configured to detect light that enters the substrate from the back side.

17. The image sensor device of claim 15, wherein the metal shield is a tensile device.

18. The image sensor device of claim 15, further including:
    a third compressively-stressed layer formed between the substrate and the first compressively-stressed layer; and
    a fourth compressively-stressed layer formed on the second compressively-stressed layer.

19. The image sensor device of claim 18, wherein:
    the third compressively-stressed layer contains an oxide material; and
    the fourth compressively-stressed layer contains a nitride material.

* * * * *